(12) United States Patent
El Afandy et al.

(10) Patent No.: US 11,529,605 B2
(45) Date of Patent: Dec. 20, 2022

(54) FLEXIBLE ARTIFICIAL LEAVES FOR HYDROGEN PRODUCTION AND METHODS FOR MAKING

(71) Applicant: King Abdullah University of Science and Technology, Thuwal (SA)

(72) Inventors: Rami Tarek El Afandy, Thuwal (SA); Mohamed Ebaid Abdrabou Hussein, Thuwal (SA); Boon S. Ooi, Thuwal (SA); Tien Khee Ng, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 951 days.

(21) Appl. No.: 16/331,624

(22) PCT Filed: Sep. 8, 2017

(86) PCT No.: PCT/IB2017/055437
§ 371 (c)(1),
(2) Date: Mar. 8, 2019

(87) PCT Pub. No.: WO2018/047113
PCT Pub. Date: Mar. 15, 2018

(65) Prior Publication Data
US 2019/0358605 A1      Nov. 28, 2019

Related U.S. Application Data

(60) Provisional application No. 62/384,882, filed on Sep. 8, 2016.

(51) Int. Cl.
*H01L 21/02* (2006.01)
*B01J 19/12* (2006.01)
*C01B 3/04* (2006.01)
*C01B 13/02* (2006.01)
*C25B 11/02* (2021.01)
(Continued)

(52) U.S. Cl.
CPC .......... *B01J 19/127* (2013.01); *B01J 19/123* (2013.01); *C01B 3/042* (2013.01); *C01B 13/0207* (2013.01); *C25B 1/55* (2021.01); *C25B 11/02* (2013.01); *H01L 21/0254* (2013.01); *H01L 21/02603* (2013.01); *H01L 29/2003* (2013.01)

(58) Field of Classification Search
CPC ...... B81C 2201/013; B81C 2201/0133; H01L 21/02603
See application file for complete search history.

(56) References Cited

U.S. PATENT DOCUMENTS

2016/0273115 A1\*  9/2016  Mi ........................ C01B 3/042

FOREIGN PATENT DOCUMENTS

WO        2016/015134        2/2016

OTHER PUBLICATIONS

Neplokh et al., "Substrate-Free InGaN/GaN nanowire light-emitting diodes", Nanoscale Research Letter (2019)—supplied by Applicant.\*
(Continued)

*Primary Examiner* — Thomas T Pham
(74) *Attorney, Agent, or Firm* — Billion & Armitage

(57) ABSTRACT

Devices for photoelectrodes for water splitting based on indium nanowires on flexible substrates as well as methods of manufacture by transferring nanowire arrays to flexible substrates.

18 Claims, 10 Drawing Sheets

(51) Int. Cl.
  *H01L 29/20* (2006.01)
  *C25B 1/55* (2021.01)

(56) References Cited

OTHER PUBLICATIONS

Notification of Transmittal of the International Search Report and the Written Opinion of the International Searching Authority, or the Declaration for PCT/IB2017/055437 dated Jan. 12, 2018.
Wei, et al., "Enhanced photoelectrochemical water-splitting effect with a bent ZnO nanorod photoanode decorated with Ag nanoparticles", Nanotechnology 23 (2012) 235401.
Alotaibi, et al., "A metal-nitride Nanowire Dual-Photoelectrode Device for Unassisted Solar-to-Hydrogen Conversion under Parallel Illumination", NANO Letters, vol. 15, No. 10, Sep. 16, 2015, 6821-6828.
Alotaibi, et al., "Highly stable photoelectrochemical water splitting and hydrogen generation using a double-band InGaN/GaN core/shell nanowire photoanode", Nano letters 13.9 (2013): 4356-4361.
Dai, et al., "Flexible Light-Emitting Diodes Based on Verticl Nitride Nanowires", Nano Letters,, 15, 2015, 6958-6964.
Kibria, et al., "One-Step Overall Water Splitting under Visible Light Using Multiband InGaN/GaN Nanowire Heterostructures", 7(9) 788607893 (2013).
Lee, et al., "Flexible Inorganic Nanostructure Light-Emitting Diodes Fabricated on Graphene Films", Advanced Materials, 23, 2011, 4614-4619.
Neplokh, et al., "Substrate-Free InGaN/GaN Nanowire Light- Emitting Diodes", Nanoscale Research Letters,, 2015, 1-6.
Reece, et al., "Wireless solar water splitting using silicon-based semiconductors and earth-abundant catalysts", Science 334.6056 (2011): 645-648.
Rogers, et al., "Synthesis, assembly and applications of semiconductor nanomembranes", Nature 477, 45-53 (2011).
Verlage, et al., "A monolithically integrated, intrinsically safe, 10% efficient, solar-driven water-splitting system based on active, stable earth-abundant electrocatalysts in conjunction with tandem III-V light absorbers protected by amorphous $TiO_2$ films", Energy & Environmental Science 8.11 (2015): 3166-3172.
Wang, et al., "Wafer-level photocatalytic water splitting on GaN nanowire arrays grown by molecular beam epitaxy", Nano letters 11(6), 2353-2357 (2011).

\* cited by examiner

ND METHODS
FLEXIBLE ARTIFICIAL LEAVES FOR HYDROGEN PRODUCTION AND METHODS FOR MAKING

BACKGROUND

The effective capture of sunlight and subsequent conversion into chemical fuels such as hydrogen has attracted considerable attention. Compared to solar electricity, the use of chemical bonds to store solar energy promises significantly reduced device fabrication costs, as well as the cost associated with energy storage. Specifically, hydrogen production by photoelectrolysis of water with semiconductor materials can offer a clean, environmentally friendly process. However, robust and efficient materials for solar fuel systems are essential before this energy source can compete with fossil fuels.

SUMMARY

Provided are novel devices, apparatuses, and artificial leaves for absorbing solar visible radiation and photochemical water splitting. Embodiments provide a device for absorbing solar visible radiation comprising a planar nanomembrane, which is comprised of a flexible substrate, where the nanomembrane has a top surface and a bottom surface, and a plurality of indium-rich nanowires are embedded into and perpendicular to the top surface of the nanomembrane.

Embodiments also provide apparatuses and devices for photochemical water splitting, comprising a planar nanomembrane, which is comprised of a flexible substrate and has a top surface and a bottom surface, and a plurality of indium-rich nanowires that are embedded into and perpendicular to the a top surface of the nanomembrane, and when the apparatus is exposed to optical energy, it can absorb the optical energy.

Embodiments provide devices and apparatuses for absorbing solar visible radiation, comprising a nanomembrane that is planar in shape and has a top surface and a bottom surface, and is comprised of a flexible substrate, and a plurality of indium-rich nanowires which are embedded in and are oriented perpendicularly to the membrane on the top surface of the membrane.

Embodiments provide methods of making membranes for solar water splitting comprising: a) forming a layer of indium-rich nanowires on the top surface of a hosting substrate, where the hosting substrate has at least two surfaces, including a top surface and a bottom surface, and the nanowires are embedded perpendicularly into the top surface of the hosting substrate, b) depositing a contact layer across the top of the nanowires, c) patterning a photoresist onto the contact layer, d) etching the contact layer, wherein the underlying nanowire layer is exposed, e) etching the nanowires of the nanowire layer to expose the substrate, f) depositing a thick support layer on the top of the contact layer, g) etching the substrate layer, and h) lifting off the formed membrane. Alternative embodiments provide methods of making membranes for solar water splitting comprising selected steps from the sequences of steps labeled a) through h), above.

The details of one or more examples are set forth in the description below. Other features, objects, and advantages will be apparent from the description and from the claims.

BRIEF DESCRIPTION OF DRAWINGS

This written disclosure describes illustrative embodiments that are non-limiting and non-exhaustive. In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document. Reference is made to illustrative embodiments that are depicted in the figures, in which:

FIG. 2 provides optical microscope images of the nanowires membrane.

FIG. 3 provides scanning electron microscope (SEM) images of the nanowires membrane.

FIG. 4. provides the spectrum of photoluminescence (PL) emission from nanowires membranes.

FIG. 6 depicts scanning electron microscopy (SEM) images of different stages along the fabrication process of InGaN nanowire photo-electrode.

FIG. 8 illustrates the optical characterization of the fabricated photo-electrode.

DETAILED DESCRIPTION

Figure 1:
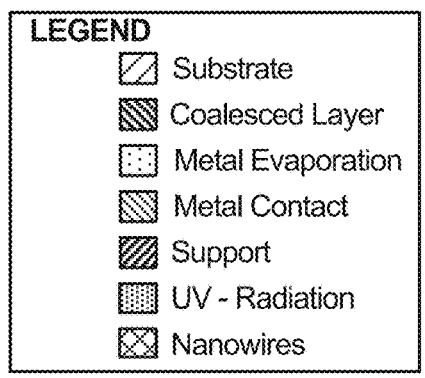
FIG. 1 provides an illustration of the fabrication process of the nanowires leaf for solar hydrogen generation.

Nanomembranes are known for having an extremely reduced flexural rigidity compared to bulk crystals, due to their ultrathin widths, as compared to their lateral dimensions. Thus, nanomembranes can serve as a platform for flexible devices such as light emitting diodes, laser diodes, photovoltaics, fuel cells, and solar hydrogen fuel generators. Rogers, J., Lagally, M. & Nuzzo, R. Synthesis, assembly and applications of semiconductor nanomembranes. *Nature* 477, 45-53 (2011).

In seeking to employ nanomembranes to utilize solar energy, Applicants discovered significant limitations in existing technology. The nanomembranes need to absorb most of the solar visible radiation. Thus, the InGaN bandgap needs to be within the red regime. However, large indium incorporation within thin films causes indium segregation and crystal defects, and thus the resulting nanomembrane-based devices have low quantum efficiency.

To fill the current technology and research gap, Applicants discovered that nanowires, which are able to incorporate large indium composition within their active regions due to the lateral strain relaxation, could be used in nanomembranes. Applicants have fabricated nanowires embedded within a planar nanomembrane to create devices, apparatuses, and artificial leaves. The nanowires can be fabricated using materials, such as indium gallium nitride (InGaN), indium gallium phosphide (InGaP), or aluminum gallium indium phosphide (AlGaInP), or a combination thereof, or other suitable materials, which function as the active absorbing layer of the leaf. Furthermore, leaves containing nanowires made with indium gallium nitride (InGaN), indium gallium phosphide (InGaP), or aluminum gallium indium phosphide (AlGaInP), or a combination thereof, or other similar materials, can be hybrid integrated using techniques including, but not limited to, lateral wafer bonding or thin film fusion, in order to increase the absorption efficiency of the leaf. The composition of indium in the nanowires may be between 5% and 95%. Alternatively, the composition of indium in the nanowires may be between 10% and 75%. In other embodiments, the composition of indium in the nanowires may be between composition of indium in the nanowires may be between 15% and 50%.

This combination of indium nanowires embedded within a planar membrane provides structures that have the flexibility of nanomembranes and the large indium incorporation of nanowires. Furthermore, the InGaN nanowires are grown on silicon to enhance their optical and structural properties. While silicon enables the growth of high quality nanowires, its low electrical conductivity causes an inefficient flow of electronic carriers. Such inefficiency is detrimental to the process of solar hydrogen generation which requires efficient collection of electronic carriers. Nanomembranes, besides being flexible, can be fabricated from several high electrical conductivity materials, such as gold. Therefore, in this patent, we demonstrate the operation of InGaN nanowires, attached to gold membranes, for efficient solar hydrogen generation.

Unlike Applicants' presently disclosed inventions, the science to date describes nanowires that are constructed in a rigid manner. (B. AlOtaibi, et al. "Highly stable photoelectrochemical water splitting and hydrogen generation using a double-band InGaN/GaN core/shell nanowire photoanode." Nano letters 13.9 (2013): 4356-4361; B. AlOtaibi, et al. "A Metal-Nitride Nanowire Dual-Photoelectrode Device for Unassisted Solar-to-Hydrogen Conversion under Parallel Illumination." Nano Letters 15.10 (2015): 6821-6828; Defa Wang, et al. "Wafer-level photocatalytic water splitting on GaN nanowire arrays grown by molecular beam epitaxy", Nano letters 11(6), 2353-2357 (2011); Md G. Kibria, et al., "One-Step Overall Water Splitting under Visible Light Using Multiband InGaN/GaN Nanowire Heterostructures", 7(9) 788607893 (2013); Zetian Mi, et al., "Methods and systems relating to photochemical water splitting", WO 2016/015134 A1; Reece, Steven Y., et al. "Wireless solar water splitting using silicon-based semiconductors and earth-abundant catalysts." Science 334.6056 (2011): 645-648; Verlage, Erik, et al. "A monolithically integrated, intrinsically safe, 10% efficient, solar-driven water-splitting system based on active, stable earth-abundant electrocatalysts in conjunction with tandem III-V light absorbers protected by amorphous $TiO_2$ films." Energy & Environmental Science 8.11 (2015): 3166-3172.)

Also unlike Applicants' present invention, the existing knowledge in the art describes flexible substrate only for half reaction based water splitting using single photoelectrode. (Yuefan Wei, et al., "Enhanced photoelectrochemical water-splitting effect with a bent ZnO nanorod photoanode decorated with Ag nanoparticles", Nanotechnology 23 (2012) 235401.)

In contrast, Applicants' invention combines water oxidation and hydrogen reduction in a seamless manner, thereby enhancing the efficiency of overall water splitting. Further, Applicants' novel artificial leaves, flexible devices and nanowire-embedded nanomembranes mimic the photosynthetic process that naturally occurs within a leaf when the energy of sunlight is converted into chemical energy by splitting water to produce $O_2$ and hydrogen equivalents.

Figure 1A:
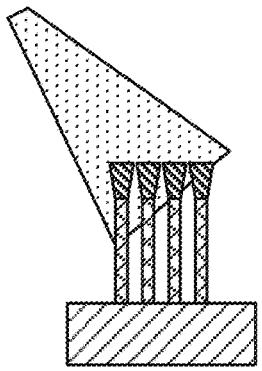
FIG. 1AA is the legend for FIGS. 1A-G and appears at the top of the drawing. Before (FIG. 1A) and after (FIG. 1B) oblique metal deposition.
Figure 1B:
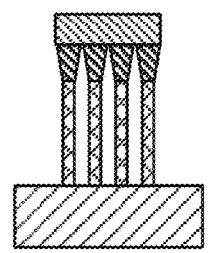
FIG. 1C shows a support material (such as SU-8, PDMS, parylene, photoresist) is deposited. Before (FIG. 1D) and after (FIG. 1E) VIAS are opened within the support material. In other embodiments, holes are opened within the support material (not shown).
FIG. 1F shows the substrate is etched away (chemical or physical etching or mechanical detachment) and the result is a freely suspended film.
FIG. 1G shows two membrane photo-electrodes (pInGaN and nInGaN) are attached back to back to form the artificial leaf.
Figure 1C:
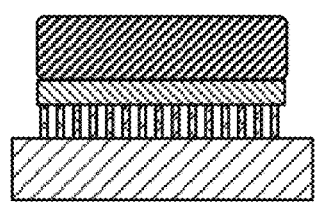
Figure 1D:
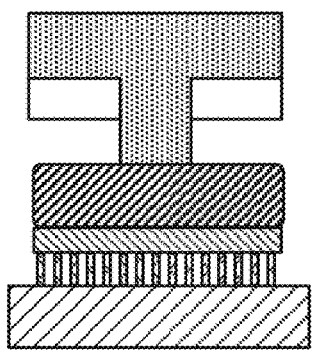
Figure 1E:
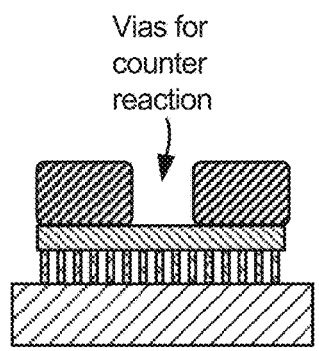
Figure 1F:
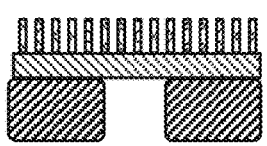
Figure 1G:
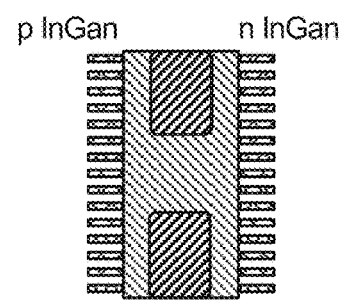

In certain embodiments, the process of fabricating Applicants' artificial leaves can be as follows and is illustrated in FIG. 1. First, InGaN nanowires are fabricated (grown or etched) on a substrate. The nanowires top should have wider diameters compared to their bottom in order to prevent electrical short circuit from occurring during the operation (FIG. 1A). After depositing the metal for the top electrode (FIG. 1B), a supporting layer (such as SU-8, PDMS, parylene and photoresist) is deposited (FIG. 1C). Then through optical lithography, through holes are formed within the supporting layer to gain access to the top electrode (FIG. 1D and FIG. 1E). The back substrate is then etched away (chemically, physically or mechanically) (FIG. 1F) and thus forming a freely suspended membrane photo-electrode. When two membrane photo-electrodes are fabricated (each with a different doping polarity), they can be attached back to back by a conductive material to form an artificial leaf structure (FIG. 1G).

In other embodiments, the artificial leaves may be fabricated as follows. If the conductive material is mechanically stable, the step of depositing a support can be skipped in the fabrication process. Nanowires are first formed (either through top down or bottom up techniques) on a hosting substrate. A contact layer is then deposited which is used to draw photo-generated electrons from the underlying nanowires. Through lithography, a photoresist is patterned and then used to etch down the contact layer to expose the underlying nanowires layer. Instead of etching down the metal to form the etch holes, a photoresist can been spin-coated first, then, using metal liftoff technique, the etch holes will be formed. The nanowires are then etched to expose the substrate. Since the formed nanowires are very thin (100s of nanometers) a thick (several microns) support layer is deposited on top of the contact layer. The supporting layer can be, but not limited to, Parylene or SU-8. The deposition technique depends on the material used (for example, chemical vapor deposition for Parylene or spin-coating for SU8). Parylene is a tradename for a variety of poly(p-xylene) polymers, while SU8 is an epoxy-based negative photoresist. Both of them are off the shelf products. While this layer supports the structure, it should not fully cover it to allow the substrate to be etched and the contact layer to be electrically probed. Finally, the substrate is etched away (either using dry or wet etching) to liftoff the formed membrane. Optionally, instead of etching the substrate, the nanowires can be formed on a sacrificial layer, which is then sacrificially etched away. The sacrificial layer can be, but is not limited to, titanium or molybdenum. The deposition technique can be metal sputtering or electron beam evaporation.

Embodiments provide a device for absorbing solar visible radiation, comprising a plurality of indium nanowires, wherein a high concentration of indium is incorporated into said nanowires, and wherein said nanowires are embedded in a planar nanomembrane, wherein the nanomembrane is comprised of a flexible substrate and is flexible. In some embodiments, indium gallium nitride nanowires are used. In other embodiments, indium gallium nitride (InGaN), indium gallium phosphide (InGaP), or aluminum gallium indium phosphide (AlGaInP), or a combination thereof may be used in the fabrication of the nanowires.

Embodiments include an artificial leaf or more than one artificial leaf for photochemical water splitting, comprising a plurality of indium nanowires, wherein a high concentration of indium is incorporated into said nanowires, and wherein said nanowires are embedded in a planar nanomembrane, wherein the nanomembrane is comprised of a flexible substrate. When exposed to optical energy within a predetermined wavelength range, said artificial leaf or leaves can absorb optical energy. In some embodiments, indium gallium nitride nanowires are used.

Embodiments also provide methods of making any of the devices, nanowires, apparatuses, nanomembranes or artificial leaves described herein.

Further, embodiments include the use any of the devices, nanowires, nanomembranes, apparatuses, or artificial leaves described herein, as photoanodes for photoelectrochemical water splitting.

The devices, nanowires, nanomembranes, apparatuses, and artificial leaves of the present invention provide high quantum efficiency and a high degree of flexibility.

As used herein, the recited terms have the following meanings. All other terms and phrases used in this specification have their ordinary meanings, as one of skill in the art would understand after review of this disclosure.

Embodiments include a device for absorbing solar visible radiation, comprising a plurality of indium-rich nanowires, said nanowires having at least a top surface and a bottom surface, a metal contact layer, having at least a top surface and a bottom surface, and said metal contact layer being affixed to the top surface of each nanowire, a supporting layer, having at least a top surface and a bottom surface and being affixed to the top surface of the metal layer, wherein the supporting layer has one or more holes, said holes situated from the top surface of the supporting layer through the bottom surface of the supporting layer, said holes having a diameter and a depth, and wherein the location of the each hole corresponds to an exposed area of the metal contact layer.

Additional embodiments of the device nanowires containing indium gallium nitride, indium gallium phosphide, or aluminum gallium indium phosphide, or a combination thereof. The percentage of indium in the nanowires in the device is between 15% and 50%. In other embodiments, the metal contact layer of the device is comprised of gold or nickel, or a combination thereof. In addition, in certain embodiments, the diameter of the top surface of each nanowire in the device is wider than the diameter of the bottom surface of each nanowire. With regard to the device, the supporting layer can be SU-8, PDMS, parylene, or photoresist. In still other embodiments, a plurality of devices is disposed in a plurality of artificial leaves.

In some embodiments, two devices are attached together at the top side of each metal contact layer, and wherein each device has a different doping polarity. In further embodiments, the device can be activated using visible light irradiation in the range of from about 400 nm to about 700 nm.

Additionally provided is an apparatus for photochemical water splitting, comprising the device as provided herein, wherein when the device is exposed to optical energy, the device can absorb said optical energy. In certain embodiments, the apparatus absorbs optical energy in the range from about 400 nm to about 700 nm. In other embodiments, a plurality of apparatuses is disposed in one or more artificial leaves or two or more of the apparatuses are attached together. In still other embodiments, two apparatus are attached together at the top side of each metal contact layer, and wherein each apparatus has a different doping polarity.

In an embodiment, provided is a method of making a membrane for solar water splitting, comprising a substrate, having at least a top surface and a bottom surface, forming a layer of indium-rich nanowires on the top surface of the substrate, said nanowires having a top surface and a bottom surface, wherein the bottom surface of each nanowire is embedded perpendicularly into the top surface of the hosting substrate, depositing a metal contact layer across the top surface of the nanowires, said contact layer having at least a top surface and a bottom surface, depositing a supporting layer across the top surface of the contact layer, said supporting layer having at least a top surface and a bottom surface, etching the supporting layer to form holes in said supporting layer, wherein the location of the each hole corresponds to an exposed area of the metal contact layer, removing the substrate by etching, wherein a freely suspended membrane photo-electrode is formed. In certain embodiments of the method of making a membrane for solar water splitting, the substrate is silicon and the supporting layer is PDMS, photoresist, Parylene, or SU-8. In other embodiments of the method of making a membrane for solar water splitting, the etching is done using lithography. In still other embodiments, the substrate is removed by chemical, physical or mechanical etching.

In other embodiments of the method of making a membrane for solar water splitting, nanowires contain indium gallium nitride, indium gallium phosphide, or aluminum gallium indium phosphide, or a combination thereof, and the composition of indium is between 15% and 50%.

Optionally, in one or more embodiments of the method of making a membrane for solar water splitting, a sacrificial layer is grown under the nanowires following the formation of the layer of nanowires on the substrate. Additionally, the sacrificial layer is comprised of titanium.

In another embodiment, provided is a photoelectrode, comprising a plurality of indium-rich nanowires, a first metal contact layer, a second metal contact layer, a flexible substrate, and an insulating layer. Optionally, the photoelectrode further comprises a layer of conductive epoxy.

In certain embodiments of the photoelectrode, the nanowires contain indium gallium nitride, indium gallium phosphide, or aluminum gallium indium phosphide, or a combination thereof, and the composition of indium is between 15% and 50%.

In other embodiments of the photoelectrode, the first and the second metal contact layer are each comprised of gold, nickel or a combination thereof, and the flexible substrate is comprised of polyamide film. In embodiments of the photoelectrode, the insulating layer is comprised of PDMS, photoresist, SU-8, insulating epoxy, or parlyene.

Embodiments also provide a method of making a photo electrode, comprising creating a first structure, comprising i) a substrate, having at least a top surface and a bottom surface and ii) forming a layer of indium-rich nanowires on the top surface of the substrate, said nanowires having a top surface and a bottom surface, wherein the bottom surface of each nanowire is embedded perpendicularly into the top surface of the hosting substrate, then iii) depositing one or more metal contact layers across the top surface of the nanowires, said contact layer having at least a top surface and a bottom surface; and creating a second structure, comprising i) flexible substrate, having at least a top surface and a bottom surface, ii) forming a metal contact layer across the top surface of the flexible structure, said contact layer having at least a top surface and a bottom surface, wherein the bottom surface of the contact layer is adhered to the top surface of the flexible surface, joining the first structure to the second structure by attaching the top surface of a metal contact layer of the first structure to the top of the contact layer of the second structure to create a third structure, removing the substrate of the first structure from the third structure, thereby exposing the bottom surface of the nanowires and finally, adhering an insulating material to the third structure.

In embodiments of the method of making a photoelectrode, the nanowires contain indium gallium nitride, indium gallium phosphide, or aluminum gallium indium phosphide, or a combination thereof, and the composition of indium is between 15% and 50%. In other embodiments of the method of making a photoelectrode, one metal contact layer of the first structure is comprised of gold and a second metal contact layer of the first structure is comprised of nickel. In other embodiments of the method of making a photoelectrode, the metal contact layer of the second structure is comprised of gold. In further embodiments of the method of making a photoelectrode, a gold metal contact layer of the first structure is joined to a gold metal contact layer of the second structure. In other embodiments of the method of making a photoelectrode, the substrate is comprised of silicone.

In other embodiments of the method of making a photoelectrode, the first and second structures are attached by a layer of conductive epoxy. In still other embodiments, the flexible substrate is comprised of polyamide film and the insulating layer is comprised of PDMS, photoresist, SU-8, insulating epoxy, or parlyene.

Further embodiments provide the use of any of the devices, apparatuses, nanowires, photoelectrodes, nanomembranes, or artificial leaves described herein, as photoanodes for photoelectrochemical water splitting.

Additional embodiments provide the use of any of the devices, apparatuses, nanowires, photoelectrodes, nanomembranes, or artificial leaves described herein, to produce hydrogen from water by photoelectrolysis.

Definitions:

As used herein, the recited terms have the following meanings. All other terms and phrases used in this specification have their ordinary meanings as one of skill in the art would understand.

References to "one embodiment", "an embodiment", etc., indicate that the embodiment described may include a particular aspect, feature, structure, or characteristic, but not every embodiment necessarily includes that aspect, feature, structure, or characteristic. Moreover, such phrases may, but do not necessarily, refer to the same embodiment referred to in other portions of the specification. Further, when a particular aspect, feature, structure, or characteristic is described in connection with an embodiment, it is within the knowledge of one skilled in the art to affect or connect such aspect, feature, structure, or characteristic with other embodiments, whether or not explicitly described.

The singular forms "a," "an," and "the" include plural reference unless the context clearly dictates otherwise. The term "and/or" means any one of the items, any combination of the items, or all of the items with which this term is associated. The phrase "one or more" is readily understood by one of skill in the art, particularly when read in context of its usage. The term "about" can refer to a variation of ±5%, ±10%, ±20%, or ±25% of the value specified. For integer ranges, the term "about" can include one or two integers greater than and/or less than a recited integer at each end of the range. Unless indicated otherwise herein, the term "about" is intended to include values proximate to the recited range that are equivalent in terms of the functionality of the individual ingredient, the composition, or the embodiment.

As used herein, "solar water splitting," "photo-electric water splitting," and "photo catalytic water splitting" can be used interchangeable and refer to an artificial photosynthesis process with photocatalysis in a photoelectrochemical cell used for the dissociation of water into its constituent parts, hydrogen ($H_2$) and Oxygen (O), using either artificial or natural light or visible light.

"Photoanodes," as used herein, refers to anodes of a photoelectric cell or cells. As used herein, "photocathode" refers to cathodes of a photoelectric cell or cells.

The term "artificial leaves" refers to a device or apparatus that, using artificial or natural light, can split water into hydrogen and oxygen without need for external connections. Like naturally occurring leaves, artificial leaves can convert sunlight energy directly into storable chemical form.

"Substrate," as used throughout, denotes a substance of layer that underlies the nanomembrane. Suitable substances for use as substrates include silicone, and the like. As used herein, "substrate layers" refers to a sheet or thickness of substrate.

"Planar," as used herein, relates to or is in the form of a geometric plane.

The term "flexible" is defined as capable of bending easily, without breaking, pliable, supple, or bendable.

"Support layer," or "supporting lawyer," may be used interchangeably and as used herein, refer to a sheet or thickness of material that can be, but is not limited to, SU-8, polymethylsiloxane (PDMS), parylene or photoresist. The supporting layer is situated atop the metal contact layer in the artificial leaves and nanomembranes provided herein and provides support for the structures.

Further, "contact layer" or "metal contact layer," as used throughout, refers to the layer of metal placed deposited onto of the nanowires in the nanomembranes, devices, apparatuses, and artificial leaves described herein. The contact layer is used to draw photo-generated electrons from the underlying nanowires.

"Sacrificial layer," as used herein, may be used when a fabricating a nanomembrane, device, apparatus or artificial leaf. Instead of etching the substrate, the nanowires can be formed on a sacrificial layer, which is then sacrificially etched away. The sacrificial layer can be grown underneath the nanowires to facilitate the etching process. The sacrificial layer can be but is not limited to, titanium or molybdenum.

"Embedding," which is used herein, means making an integral part or enclosing in a supporting substance.

"Photoresist" is defined as a photosensitive resin that loses resistance to chemical or other etching when exposed to radiation.

As used herein, "etching" is defined as the act or process of making a design or cut into portions of a metal surface. Etching may be done chemically, mechanically, or physically. In certain embodiments, plasma etching is done using an inductively coupled plasma reactor with Argon ions. As used herein, the term "lithography" refers to printing or marking a pattern or patterns on the surface of an object, or structuring patterns on materials. The types of lithography suitable for use in the fabrication processes and methods provided herein include optical lithography and the like.

"Nanowire," as used herein, refers to nanostructures, including but not limited to rods and tubes, made of semiconducting material. Nanowires may have dimensions of the order of one or a few nanometers. Alternatively, nanowires may have dimensions greater or smaller than one or a few nanometers. Nanowires may be made from various compounds, including but not limited to Indium-Gallium Phosphide (InGaP), Indium-Gallium Nitride (InGaN), or Aluminum Gallium Indium Phosphide (AlGaInP), or a combination thereof. The composition of Indium in the nanowires of the present invention can be between 5% and 95%. Alternatively, the composition of indium in the nanowires may be between 10% and 75%. In other embodiments, the composition of indium in the nanowires may be between composition of indium in the nanowires may be between 15% and 50%.

"Nanomembrane," which is used throughout this document, refers to free-standing structures with thickness measurements in the range of 1-100 nm, or in the range of 0.01-500 nm. Nanomembranes may be filters that separate compounds at the molecular level.

"Visible light" refers to a form of electromagnetic (EM) radiation. Generally visible light is defined as the wavelengths that are visible to most human eyes, which are generally wavelengths from about 390 to 700 nm. The visible light irradiation used to activate the devices, apparatuses and artificial leaves of the present invention is between about 400 nm to about 700 nm. "Optical energy" or "optical power" refers to the degree to which a lens, mirror or other optical system converges or diverges light.

"Insulator" as used herein refers to a substance that does not readily allow the passage of heat or does not readily conduct electricity.

The following Examples are intended to illustrate the above invention and should not be construed as to narrow its scope. One skilled in the art will readily recognize that the Examples suggest many other ways in which the invention could be practiced. It should be understood that numerous variations and modifications may be made while remaining within the scope of the invention.

EXAMPLES

Example 1: Artificial Leaf Fabrication

The process of fabricating flexible artificial leaves is demonstrated in FIG. 1 and is described in detail in subsequent paragraphs. In summary, the fabrication process for an artificial leaf is as follows: First, InGaN nanowires are fabricated (grown or etched) on a substrate. The nanowires top should have wider diameters compared to their bottom in order to prevent electrical short circuit from occurring during the operation (FIG. 1A). After depositing the metal for the top electrode (FIG. 1B), a supporting layer is deposited (FIG. 1C). Then, through optical lithography, through holes are formed within the supporting layer to gain access to the top electrode (FIG. 1D and FIG. 1E). The back substrate is then etched away (chemically, physically or mechanically) (FIG. 1F), thus forming a freely suspended membrane photo-electrode. When two membrane photo-electrodes are fabricated (each with a different doping polarity), they can be attached back to back by a conductive material to form an artificial leaf structure (FIG. 1G). If the conductive material is mechanically stable, the step of depositing a support can be skipped in the fabrication process.

In other embodiments, an alternate fabrication process for an artificial leaf is as follows: Indium Gallium Nitride (InGaN) Nanowires were fabricated using Molecular Beam Epitaxy (MBE). Alternatively, other epitaxial growth processes, including but not limited to Metal-Organic Chemical Vapor Deposition (MOCVD) or Metal-Organic Vapour Phase Epitaxy (MOVPE), may be used to fabricate the nanowires. The composition of indium used in this example (24%) is however too high to be achieved through MOCVD. Nanowires may be comprised of indium gallium nitride (InGaN), indium gallium phosphide (InGaP), or aluminum gallium indium phosphide (AlGaInP), or a combination thereof. In this embodiment, the composition of indium in the nanowires may be between 15% and 50%.

Silicon was used as the substrate. Silicon is preferable in many cases, due to its low cost compared to other common substrates.

A sacrificial layer (such as titanium) can be grown underneath the nanowires to facilitate the etching process. The etching procedure is adjusted to selectively etch the layer underneath the nanowires.

After the nanowires are formed, a supporting layer is then deposited on the top of the nanowire. The material of the supporting layer can be SU-8, PDMS, parylene or photoresist. The supporting layer is used to draw photo-generated electrons from the underlying nanowires.

Next, using optical lithography, a photoresist is patterned on the supporting layer. The lithography process was performed as follows: A layer of AZ1512HS photoresist (thickness=1.6 micrometer) was spin-coated on the sample. Using a mask aligner, the sample was aligned with a prefabricated mask and then was irradiated by a broadband illumination to cure the photoresist. The resist was developed in Az 726 (MIF) developer to form the required etch holes. Using a chemical wet etchant (gold etchant, Aldrich Chemical), etch holes were formed within the gold layer to expose the underlying gallium nitride (InGaN/GaN) nanowires. Alternately, the etch holes can also be formed by plasma etching the gold in an inductively coupled plasma (ICP) reactor with argon ions (Ar+).

The etching of the back substrate, and when applicable, the sacrificial layer, was performed by using a Xenon difluoride ($XeF_2$) reactive gas to selectively etch away the substrate. The etching technique used is dependent on the substrate material and whether or not a sacrificial layer is placed underneath the nanowires. Thus, etching may be done chemically, mechanically, or physically. As a non-limiting example, if titanium is used as a nucleation layer for nanowires, wet etching, such as hydrofluoric acid (HF) or potassium hydroxide (KOH), can be used to remove the titanium layer.

Once the etch-holes were formed through the gold layer, the InGaN/GaN nanowires layer was etched to expose the underlying sacrificial silicone layer. This was performed by plasma etching the nanowires in ICP (argon and chlorine gas). An alternative effective approach to form the etch-holes through the nanowires is by using photoelectrolysis chemical etching (PEC) of the nanowires in HF or KOH.

Because the nanowires are very thin (100s of nanometers), a thick support layer is deposited on top of the contact layer. The supporting layer can be, but is not limited to, Parylene or SU-8. This layer supports the structure. However, it should not fully cover it, in order to allow the substrate to be etched and the contact layer to be electrically probed. Finally, the substrate is etched away (either using dry or wet etching) to liftoff the formed membrane. Instead of etching the substrate, the nanowires could be formed on a sacrificial layer, which is then sacrificially etched away.

Figure 2A:
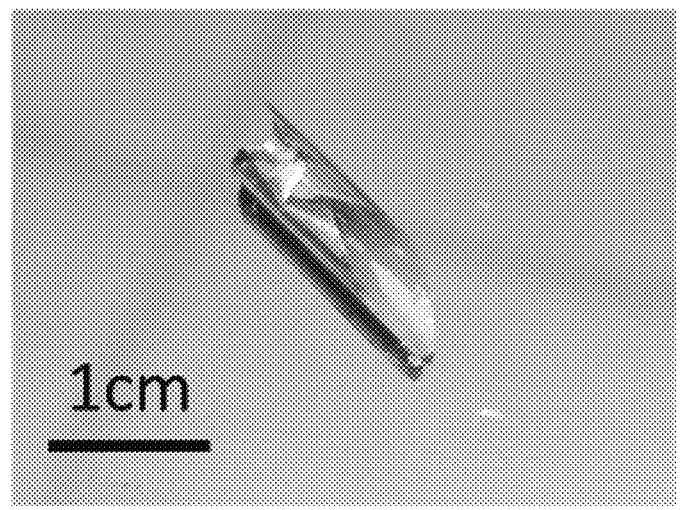
FIGS. 2A and 2B show optical images of the nanomembrane. The line in FIG. 2A represents a scale of 1 centimeter (cm).
Figure 2B:
Figure 2C:
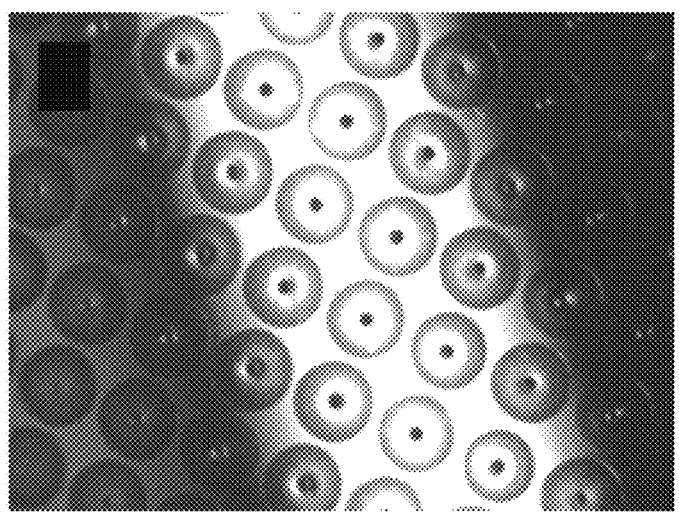
FIG. 2C shows the fabricated etch holes used to etch away the underlying substrate in order to liftoff the structure and the high flexibility of the structure.

A fabricated nanomembrane was optically imaged. (FIGS. 2A and 2B). The only limit on the lateral dimensions of the nanomembranes is the size of the original substrate prior to liftoff. An optical microscope image of the nanomembrane (FIG. 2C) reveals the fabricated etch holes that were used to etch away the underlying substrate in order to liftoff the structure. The high flexibility of the structure is also demonstrated in FIG. 2.

Figure 3A:
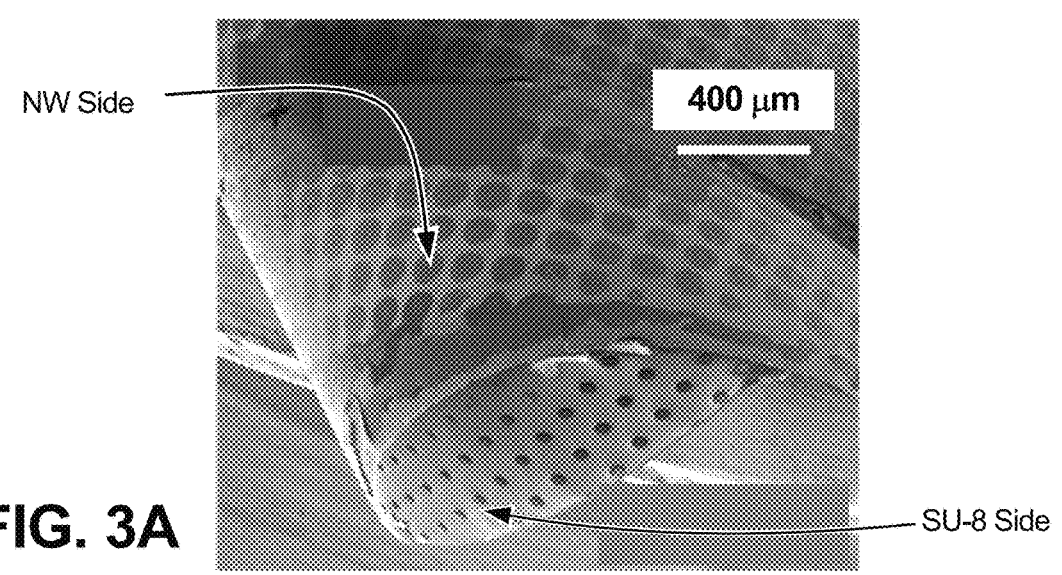
FIG. 3A shows an SEM image of a folded membrane, revealing its two sides (the nanowires side and the SU-8 support side), the top view and the inclined view SEM imaging of the nanowires side. The line in FIG. 3A represents a scale of 400 micrometers (µm).
Figure 3B:
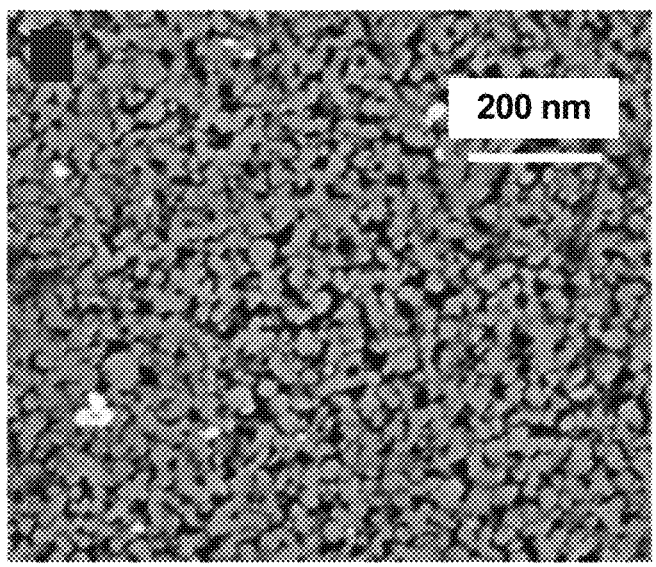
FIGS. 3B and 3C, respectively, reveal that the nanowires are successfully transferred in the liftoff process. The line in FIGS. 3B and 3C represents a scale of 200 nanometers (nm).
Figure 3C:
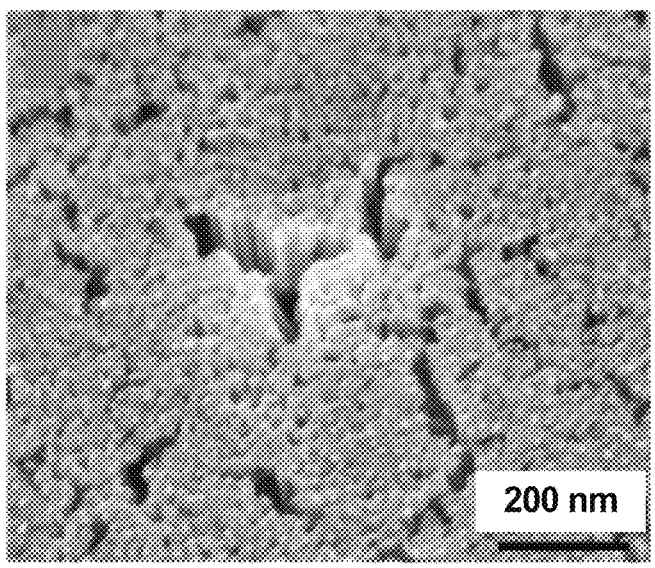
Figure 4A:
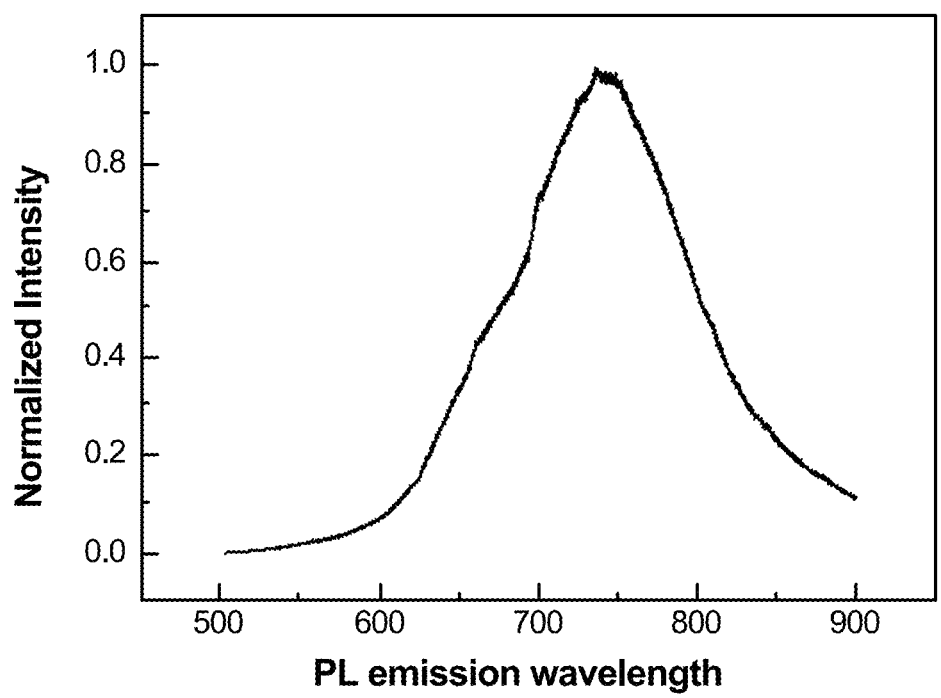
In FIG. 4A, the x-axis is the PL emission wavelength and the y-axis is the normalized intensity. The graph shows the nanowires' peak emission is at 740 nm, which allows the formed membrane to absorb most of the solar visible radiation.
Figure 4B:
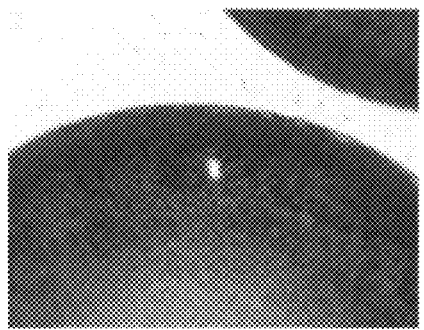
FIG. 4B shows an optical image of a 473 laser focused onto the nanowires' membrane.

Scanning electron microscopy (SEM) was performed on the fabricated membranes embedded with nanowires. The nanowires used in this study consist of two layers: GaN followed by InGaN. The InGaN layer is designed to emit at 740 nm (red color) in order to absorb the visible sun spectrum. After detaching the nanowire membrane from the substrate, the membrane was flipped upside down (making the nanowires exposed from the top). Then a laser beam (473 nm) was focused through a 100× objective lens onto the membrane. The emitted photoluminescence was collected through the same objective lens and guided to a diffraction grating where it was scattered onto a CCD camera (Synapse Horiba Jobin Yvon 354308). The CCD camera then collected the photoluminescence spectrum (intensity vs. wavelength). The PL spectrum consisted of a broad peak at 740 nm which belongs to the InGaN nanowires. FIG. 3 shows a SEM image of a folded membrane, revealing its two sides (the nanowires side and the SU-8 support side). The top view and inclined view SEM image of the nanowire side, FIGS. 3B and 3C, respectively, reveal that the nanowires are successfully transferred in the liftoff process. Interestingly, the nanowires in this state are upside down and the side apparent in the SEM images is their nucleation side. Finally, the photoluminescence (PL) emission from the nanowires membrane was measured. A 473 nm laser was focused onto the nanowires membrane (inset of FIG. 4) and the collected PL emission from the membrane is presented in FIG. 4. The peak PL emission of the nanowires in FIG. 4 is at 740 nm, which allows the formed membrane to absorb most of the solar visible radiation.

Example 2: Fabrication of a Photo-Electrode

Figure 5:
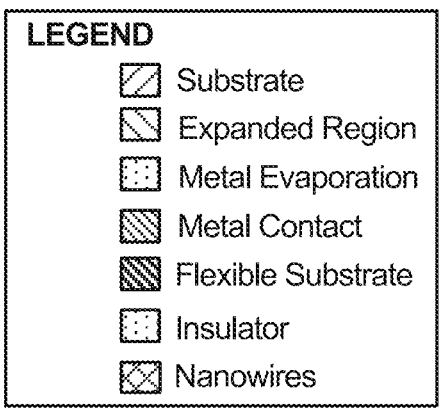
FIG. 5 depicts the fabrication process of a photo-electrode (anode or cathode).
Figure 5A:
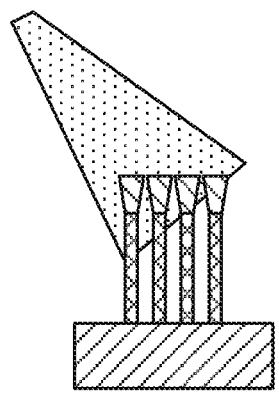
FIG. 5AA is the legend for FIGS. 5A-F and appears at the top of the drawing. Before (FIG. 5A) and after (FIG. 5B) oblique metal deposition.
Figure 5B:
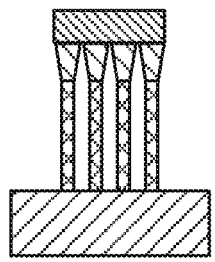
In FIG. 5C, the structure is flipped and attached to a flexible substrate.
In FIG. 5D, the original wafer is removed or etched away and an insulator is coated on the edges of the nanowire region.
FIG. 5E is a 3D illustration of the final photo-electrode structure.
FIG. 5F is an illustration of an alternate embodiment of the final photo-electrode structure.
Figure 5C:
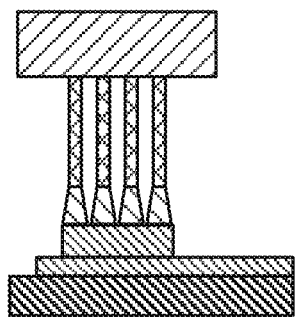
Figure 5D:
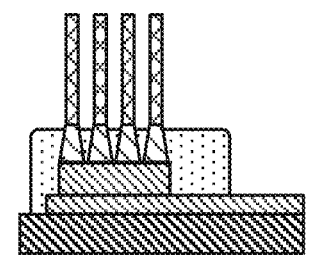
Figure 5E:
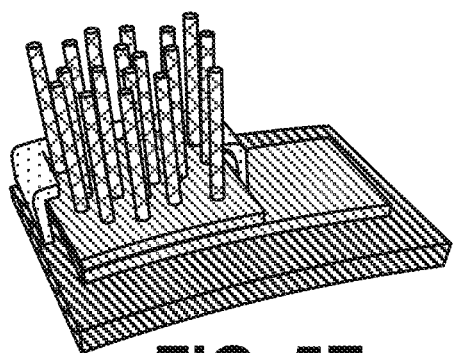
Figure 5F:
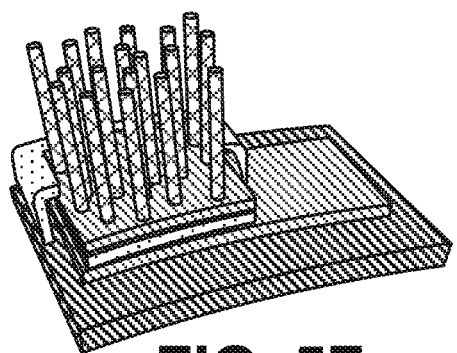

Since the artificial leaf is composed of two photo-electrodes connected back to back, we discuss the fabrication process of a single photo-electrode (anode or cathode). After forming the nanowires (FIG. 5A) and evaporating the metal contact (FIG. 5B), such as in the artificial leaf case, the structure is flipped and attached to a flexible substrate (FIG. 5C). Prior to attachment, a metal contact layer was deposited on the flexible substrate. The nanowires are then detached from their original wafer, either chemically, physically or mechanically (FIG. 5D). An insulating material is coated on the edges of the nanowire region and on the metal contact to prevent any short circuits from occurring (FIG. 5E). A 3D illustration of the final photo-electrode structure is presented in FIG. 5E.

Experimental Demonstration of a Photo-Electrode

Figure 6A:
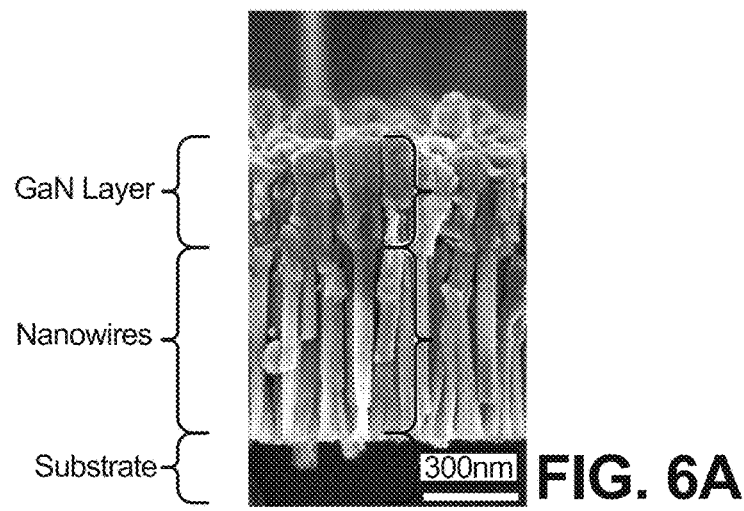
FIG. 6A shows, from top to bottom, GaN expanded top layer, InGaN nanowires, and silicon substrate.
Figure 6B:
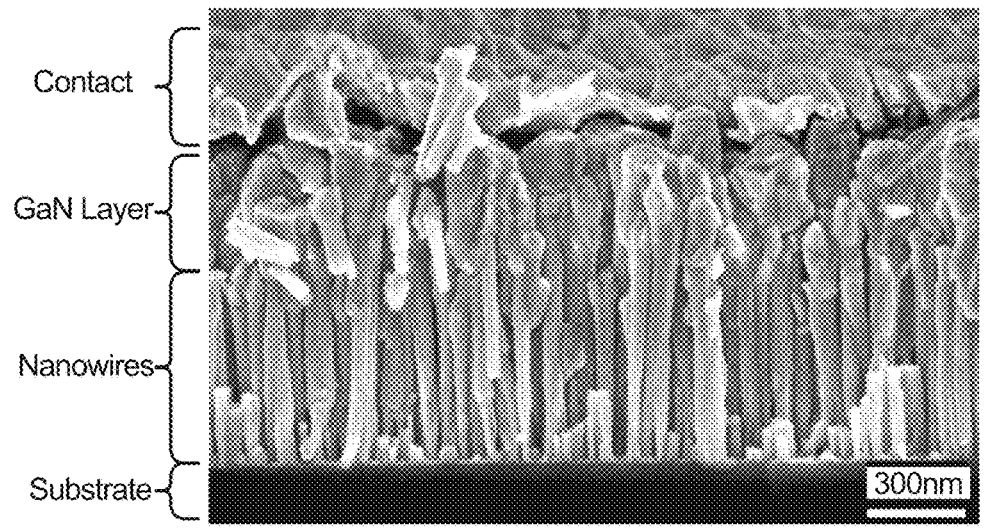
FIG. 6B shows, from top to bottom, the gold/nickel contact layer, the GaN expanded layer, InGaN nanowires, and silicon substrate.
Figure 6C:
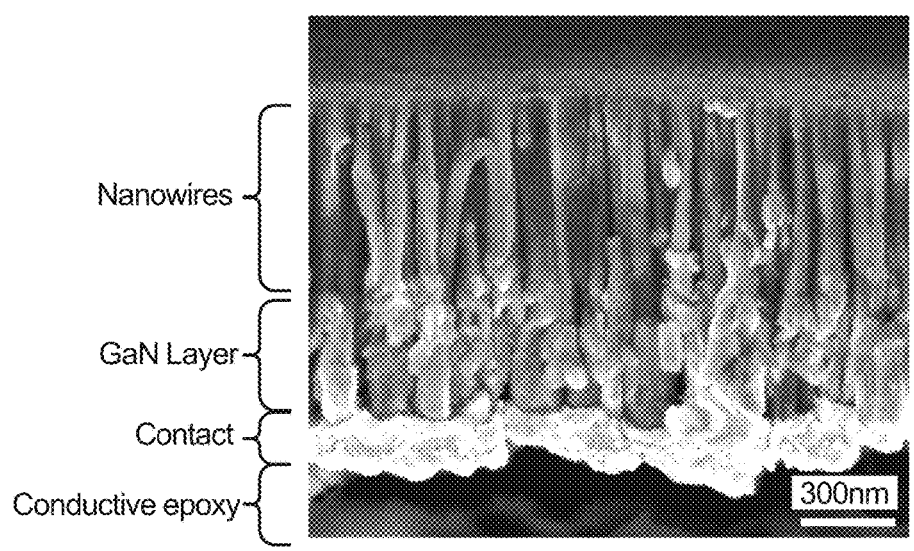
FIG. 6C shows, from top to bottom, InGaN nanowires, GaN expanded top layer, gold/nickel contact layer, and conductive epoxy layer. In each of FIGS. 6A, 6B, and 6C, the line in the SEM image represents a scale of 300 nanometers (nm).
Figure 7:
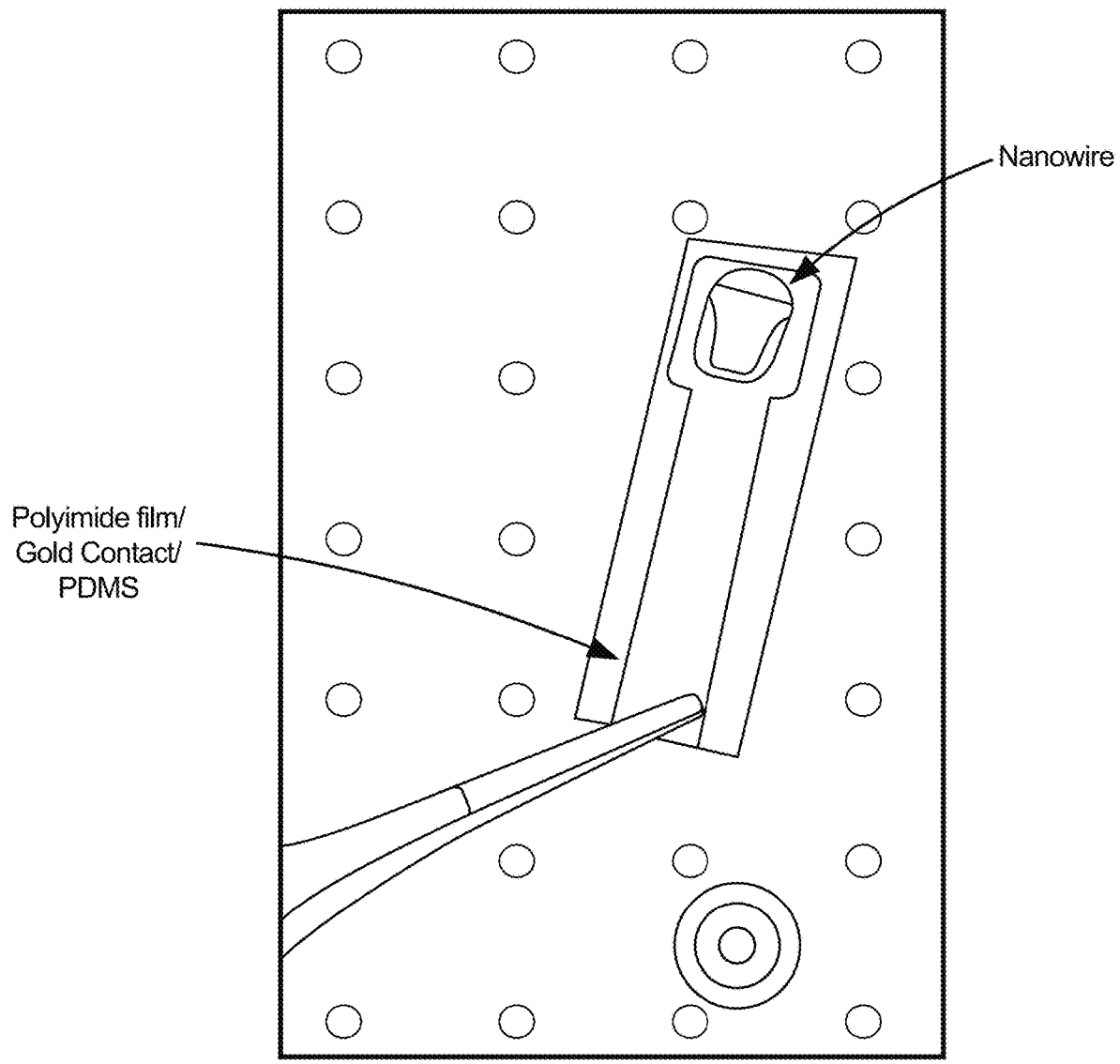
FIG. 7 depicts a photo-electrode sample.

The InGaN nanowires were grown by a molecular beam epitaxy (MBE). First an indium doped 600 nm long nanowires were grown followed by a 400 nm long GaN (FIG. 6A). The thickness of the GaN was bigger than the InGaN region in order to decrease electrolyte/metal contact interface for a better performance. 5 nm Nickel followed by 5 nm Gold were evaporated onto the sample (oblique angle) and then annealed at 550° C. for one minute to form an ohmic contact. Then a thick 150 nm layer of Gold was evaporated to form a mechanically stable metal contact (FIG. 6B). The sample was then flipped over and attached to a polyimide film with a 150 nm thick gold layer evaporated onto it. The two samples were attached together by applying an intermediate layer of a conductive epoxy (FIG. 6C). The structure was placed in $XeF_2$ gas for etching the top silicon wafer. After the entire silicon wafer was etched away, a layer of PDMS (or insulating epoxy) was applied around the nanowires region and on top of the metal contact to prevent short circuits from occurring (FIG. 7).

Figure 8A:
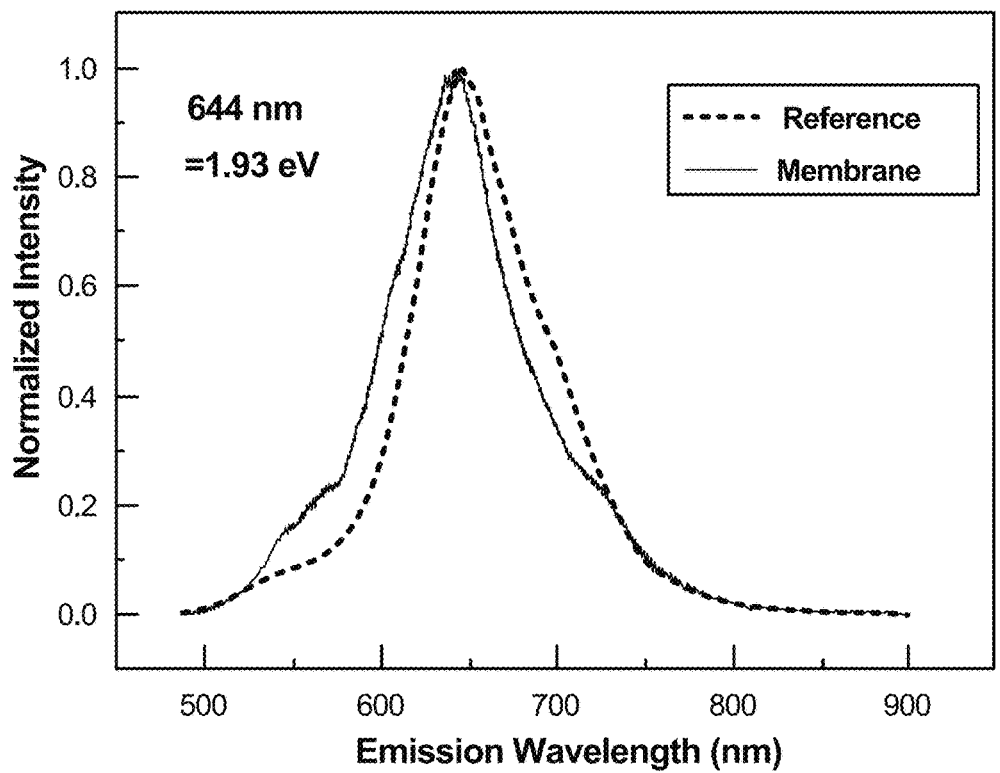
FIG. 8A provides photoluminescence measurements from before (reference, dotted line) and after (membrane, solid line) lift-off.
Figure 8B:
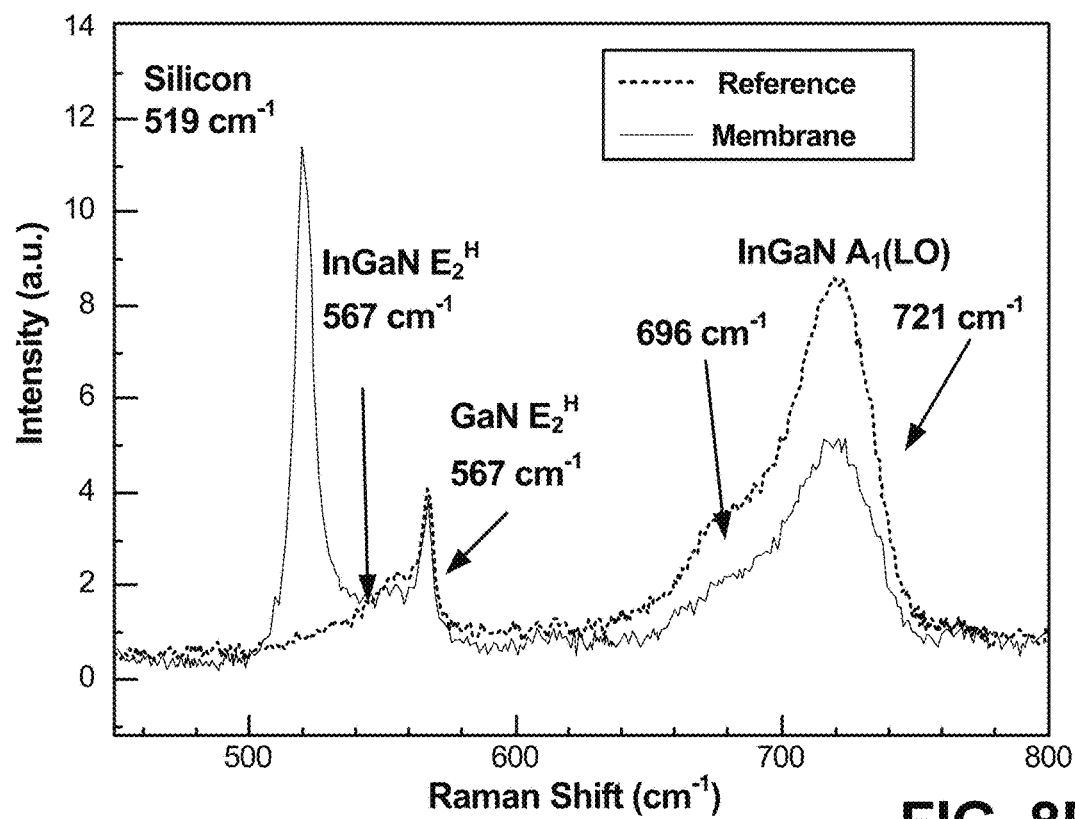
FIG. 8B provides Raman measurements from before (reference, dotted line) and after (membrane, solid line) lift-off.

Optical Characterization of the Photo-Electrode:

In order to study the effect of the lift-off process on the optical properties of the nanowires, optical measurements were performed on the samples before and after the lift-off process. A 473 nm laser was first focused onto the sample through a 100× objective lens. The photoluminescence emission was then collected through the same objective lens, filtered and then scattered onto a CCD camera to measure the emission spectrum (FIG. 8A). The peak emission was at 644 nm which allowed the conduction and valence bands to straddle the Water splitting REDOX potentials for an efficient water splitting process. The spectral peak and width also did not change after the lift-off process which demonstrates the fact that the nanowires stayed intact during the process. The Raman signal, FIG. 8B, measured from the sample before lift-off contained emission peaks from GaN, InGaN and silicon. However, the Raman signal after lift-off did not contain any emissions from silicon, which shows that indeed, all of the silicon was removed from the structure.

Figure 9:
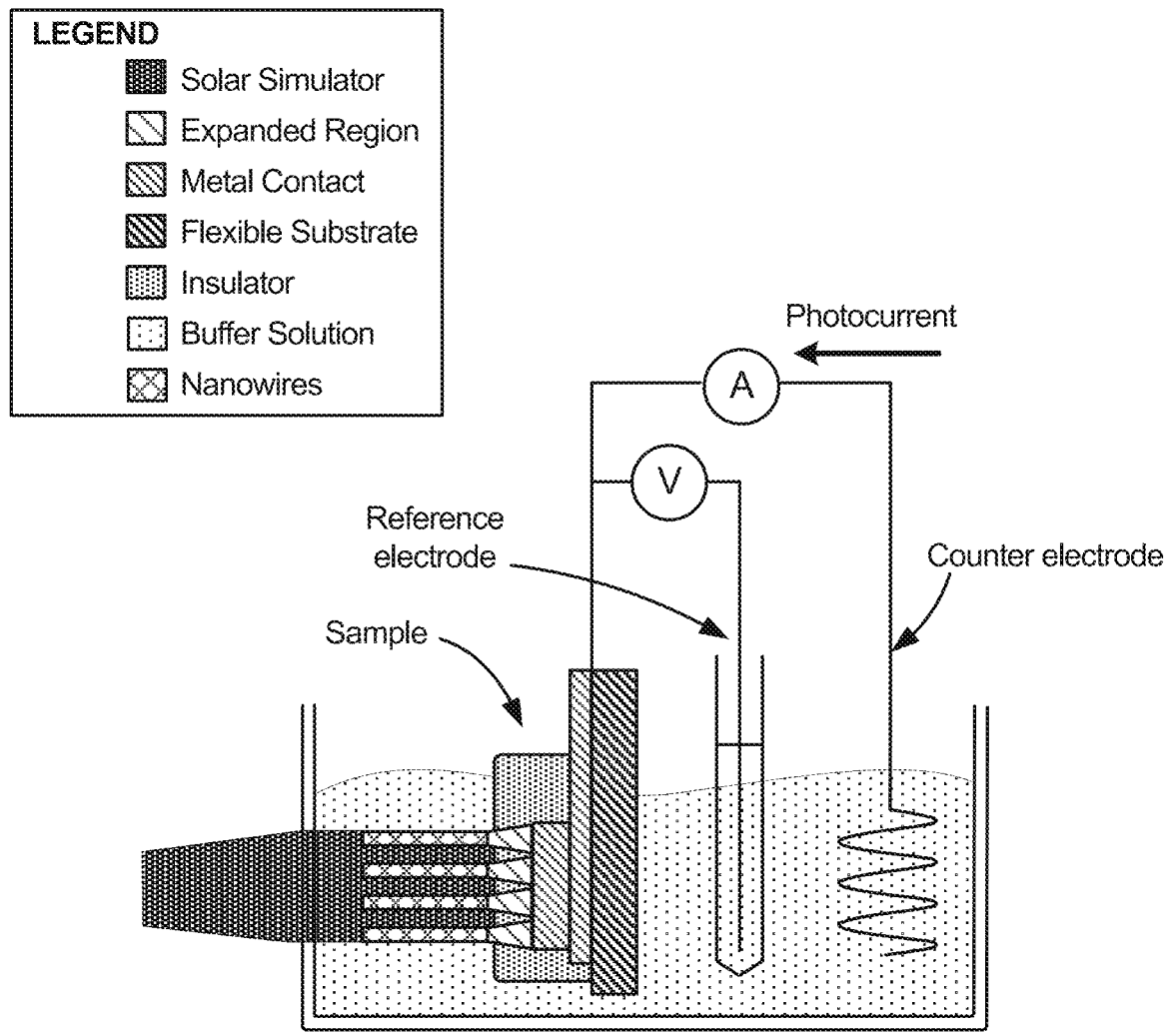
FIG. 9 illustrates a three electrode electrochemical setup.
Figure 10A:
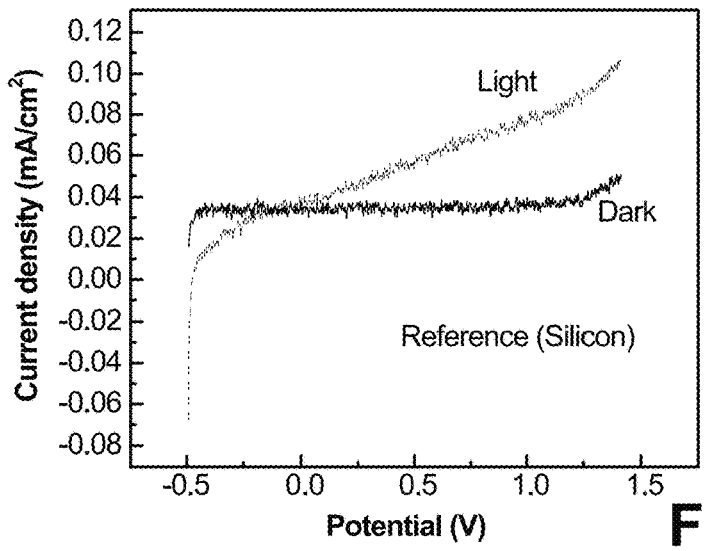
FIG. 10 provides measured photocurrent (lighter line) and dark-current (darker line) densities of the reference sample (FIG. 10A) and measured photocurrent (dashed line) and dark-current (other line) densities of the membrane sample (FIG. 10B). Photocurrent density of the membrane and reference sampled under chopped illumination (FIG. 10C).
Figure 10B:
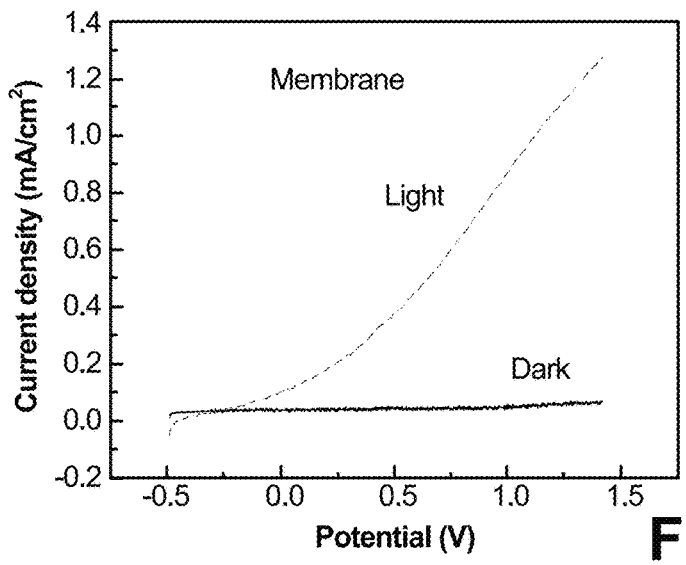
Figure 10C:
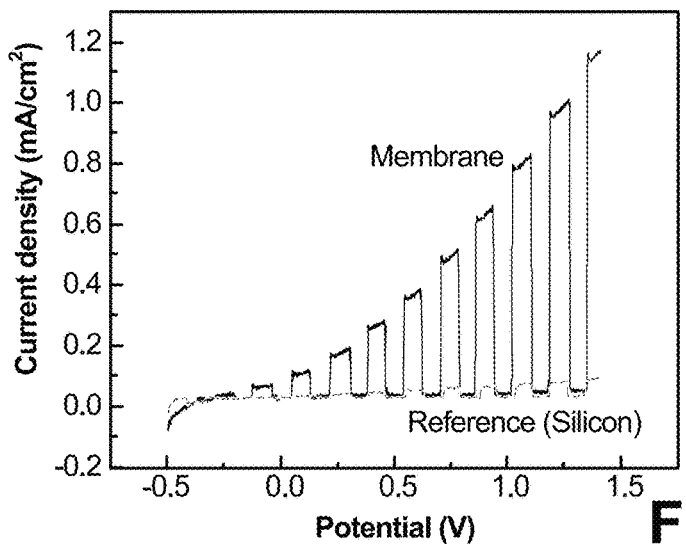

Photoelectrochemical Measurements of the Photoanode:

In order to measure the photoelectrochemical performance of the photoanode, a three electrode electrochemical setup was used (FIG. 9). The setup consisted of a working electrode (the sample), a reference electrode (Ag/AgCl) for potential measurements and a counter electrode (platinum wire) for current measurements. A solar simulator, facing the sample, was used to generate a simulated sunlight with intensity of 914 mW/cm². A potentiometer, connected to the three electrodes, was used to sweep voltage while measuring changes in the current density (presented in FIG. 10). First, the reference sample (without lift-off) was tested (FIG. 10A). The potential was swept from −0.5 to 1.5 V and the current density was measured under dark and illumination conditions. Comparing the measured data from the reference and the membrane samples, we can observe that while both had similar low dark currents (due to the high quality of InGaN nanowires), the membrane sample had more than 10 orders of magnitude of current density (FIG. 10B). The same was observed when the simulated sunlight was chopped (FIG. 10C). Such an enhancement is originating from the fact that majority carriers (electrons in this case) had to be extracted from the backside of the sample. Among several factors, the electrical conductivity of the sample highly affected the efficiency of the carrier extraction/collection processes. Since the electrical conductivity of Silicon and Gold are $10^3$ and $4.5 \times 10^7$ S/m, carrier collection in the membrane case was far more efficient leading to a higher current density.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

All publications, patents, and patent documents are incorporated by reference herein, as though individually incorporated by reference.

What is claimed is:

1. A method of making a membrane for solar water splitting, comprising:
   a. a substrate, having at least a top surface and a bottom surface;
   b. forming a layer of nanowires on the top surface of the substrate, wherein the nanowires contain indium, said nanowires having a top surface and a bottom surface, wherein the bottom surface of each nanowire is embedded perpendicularly into the top surface of the substrate;
   c. depositing a metal contact layer across the top surface of the nanowires, said contact layer having at least a top surface and a bottom surface;
   d. depositing a supporting layer across the top surface of the contact layer, said supporting layer having at least a top surface and a bottom surface;
   e. etching the supporting layer to form holes in said supporting layer, wherein the location of each hole corresponds to an exposed area of the metal contact layer; and
   f. removing the substrate by etching, wherein a freely suspended membrane photo-electrode is formed.

2. The method of claim 1, wherein the substrate is silicon.

3. The method of claim 1, wherein the supporting layer is PDMS, photoresist, Parylene, or SU-8.

4. The method of claim 1, wherein the etching is done using lithography.

5. The method of claim 1, wherein said nanowires contain indium gallium nitride, indium gallium phosphide, or aluminum gallium indium phosphide, or a combination thereof.

6. The method of claim 5, further comprising growing a sacrificial layer under the nanowires following the formation of the layer of nanowires on the substrate.

7. The method of claim 6, wherein the sacrificial layer is comprised of titanium.

8. The method of claim 1, wherein the removing of the substrate is done by chemical, physical or mechanical etching.

9. A method of making a photo electrode, comprising:
   a. creating a first structure, comprising:
      i. a substrate, having at least a top surface and a bottom surface;
      ii. forming a layer of nanowires on the top surface of the substrate, wherein the nanowires contain indium, said nanowires having a top surface and a bottom surface, wherein the bottom surface of each nanowire is embedded perpendicularly into the top surface of the substrate;
      iii. depositing one or more metal contact layers across the top surface of the nanowires, said contact layer having at least a top surface and a bottom surface;
   b. creating a second structure, comprising:
      i. a flexible substrate, having at least a top surface and a bottom surface;
      ii. forming a metal contact layer across the top surface of the flexible structure, said contact layer having at least a top surface and a bottom surface, wherein the bottom surface of the contact layer is adhered to the top surface of the flexible surface;
   c. joining the first structure to the second structure by attaching the top surface of the metal contact layer of the first structure to the top surface of the contact layer of the second structure to create a third structure;
   d. removing the substrate of the first structure from the third structure, thereby exposing the bottom surface of the nanowires; and
   e. adhering an insulating material to the third structure.

10. The method of claim 9, wherein the nanowires contain indium gallium nitride, indium gallium phosphide, or aluminum gallium indium phosphide, or a combination thereof.

11. The method of claim 9, wherein one metal contact layer of the first structure is comprised of gold.

12. The method of claim 9, wherein a second metal contact layer of the first structure is comprised of nickel.

13. The method of claim 9, wherein the metal contact layer of the second structure is comprised of gold.

14. The method of claim 9, wherein at step c) a gold metal contact layer of the first structure is joined to a gold metal contact layer of the second structure.

15. The method of claim 9, wherein the first and second structures are attached by a layer of conductive epoxy.

16. The method of claim 9, wherein the flexible substrate is comprised of polyamide film.

17. The method of claim 9, wherein the insulating layer is comprised of PDMS, photoresist, SU-8, insulating epoxy, or parlyene.

18. The method of claim 9, wherein the substrate is silicone.

* * * * *